US 10,788,323 B2

(12) United States Patent
Singer

(10) Patent No.: US 10,788,323 B2
(45) Date of Patent: Sep. 29, 2020

(54) SURVEYING INSTRUMENT, AUGMENTED REALITY (AR)-SYSTEM AND METHOD FOR REFERENCING AN AR-DEVICE RELATIVE TO A REFERENCE SYSTEM

(71) Applicant: HEXAGON TECHNOLOGY CENTER GMBH, Heerbrugg (CH)

(72) Inventor: Julien Singer, Berneck (CH)

(73) Assignee: HEXAGON TECHNOLOGY CENTER GMBH, Heerbrugg (CH)

( * ) Notice: Subject to any disclaimer, the term of this patent is extended or adjusted under 35 U.S.C. 154(b) by 376 days.

(21) Appl. No.: 15/790,019

(22) Filed: Oct. 22, 2017

(65) Prior Publication Data

US 2019/0094021 A1    Mar. 28, 2019

(30) Foreign Application Priority Data

Sep. 26, 2017 (EP) .................... 17193339

(51) Int. Cl.
| | |
|---|---|
| *G01C 15/00* | (2006.01) |
| *G06T 19/00* | (2011.01) |
| *G01C 1/04* | (2006.01) |
| *G01C 15/06* | (2006.01) |
| *G01S 17/89* | (2020.01) |
| *G06F 30/13* | (2020.01) |
| *G06Q 10/06* | (2012.01) |

(52) U.S. Cl.
CPC ............ *G01C 15/004* (2013.01); *G01C 1/04* (2013.01); *G01C 15/00* (2013.01); *G01C 15/008* (2013.01); *G01C 15/06* (2013.01); *G01S 17/89* (2013.01); *G06T 19/006* (2013.01); *G06F 30/13* (2020.01); *G06Q 10/06* (2013.01)

(58) Field of Classification Search
CPC ........ G01C 15/004; G01C 15/00; G01C 1/04; G01C 15/008; G06T 19/006
USPC ............... 342/357.11, 357.31; 345/419, 633
See application file for complete search history.

(56) References Cited

U.S. PATENT DOCUMENTS

| | | | |
|---|---|---|---|
| 7,583,373 B2 | 9/2009 | Schwarz | |
| 9,047,536 B2* | 6/2015 | Metzler | .................... G01C 1/04 |
| 9,273,946 B2* | 3/2016 | Siercks | .................. G01B 7/008 |
| 9,389,073 B2* | 7/2016 | Dumoulin | .......... G02B 26/0875 |
| 2012/0057174 A1 | 3/2012 | Briggs | |
| 2013/0218924 A1* | 8/2013 | Kim | ....................... G06F 30/13 |
| | | | 707/770 |
| 2013/0326892 A1* | 12/2013 | Schorr | ................. G01C 15/004 |
| | | | 33/228 |
| 2014/0139519 A1* | 5/2014 | Mit | ......................... G06T 11/00 |
| | | | 345/419 |

(Continued)

FOREIGN PATENT DOCUMENTS

| | | |
|---|---|---|
| CN | 106017436 A | 10/2016 |
| EP | 1 686 350 A1 | 8/2006 |

(Continued)

*Primary Examiner* — Bo Fan
(74) *Attorney, Agent, or Firm* — Maschoff Brennan

(57) ABSTRACT

A surveying instrument for providing a referencing marker designed to allow Augmented Reality (AR)-device to reference their pose relative to the reference system. The invention further relates to an AR-system comprising said surveying instrument and an AR-device. The invention further relates to a method for referencing an AR-device relative to a reference system by means of said surveying instrument.

10 Claims, 4 Drawing Sheets

(56) References Cited

U.S. PATENT DOCUMENTS

| | | | |
|---|---|---|---|
| 2014/0210856 A1* | 7/2014 | Finn | G06K 9/00671 |
| | | | 345/633 |
| 2014/0225922 A1* | 8/2014 | Sbardella | G06T 19/20 |
| | | | 345/633 |
| 2014/0347395 A1* | 11/2014 | Tsao | G02B 26/00 |
| | | | 345/633 |
| 2015/0235424 A1* | 8/2015 | Wang | G06T 7/30 |
| | | | 345/633 |
| 2017/0227360 A1 | 8/2017 | Schmidt et al. | |

FOREIGN PATENT DOCUMENTS

| | | |
|---|---|---|
| EP | 2 453 205 A1 | 5/2012 |
| EP | 2 629 210 A1 | 8/2013 |
| EP | 2 980 528 A1 | 2/2016 |

\* cited by examiner

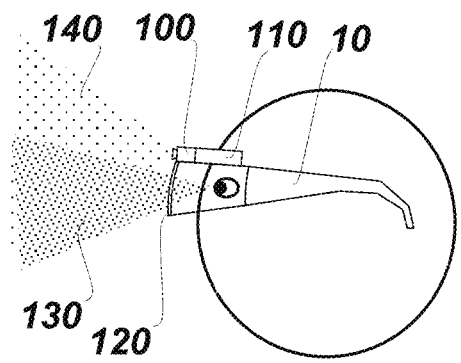
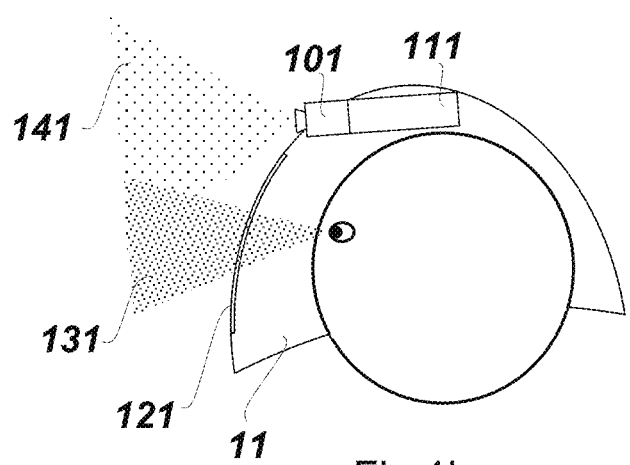
Fig.1a
Fig.1b
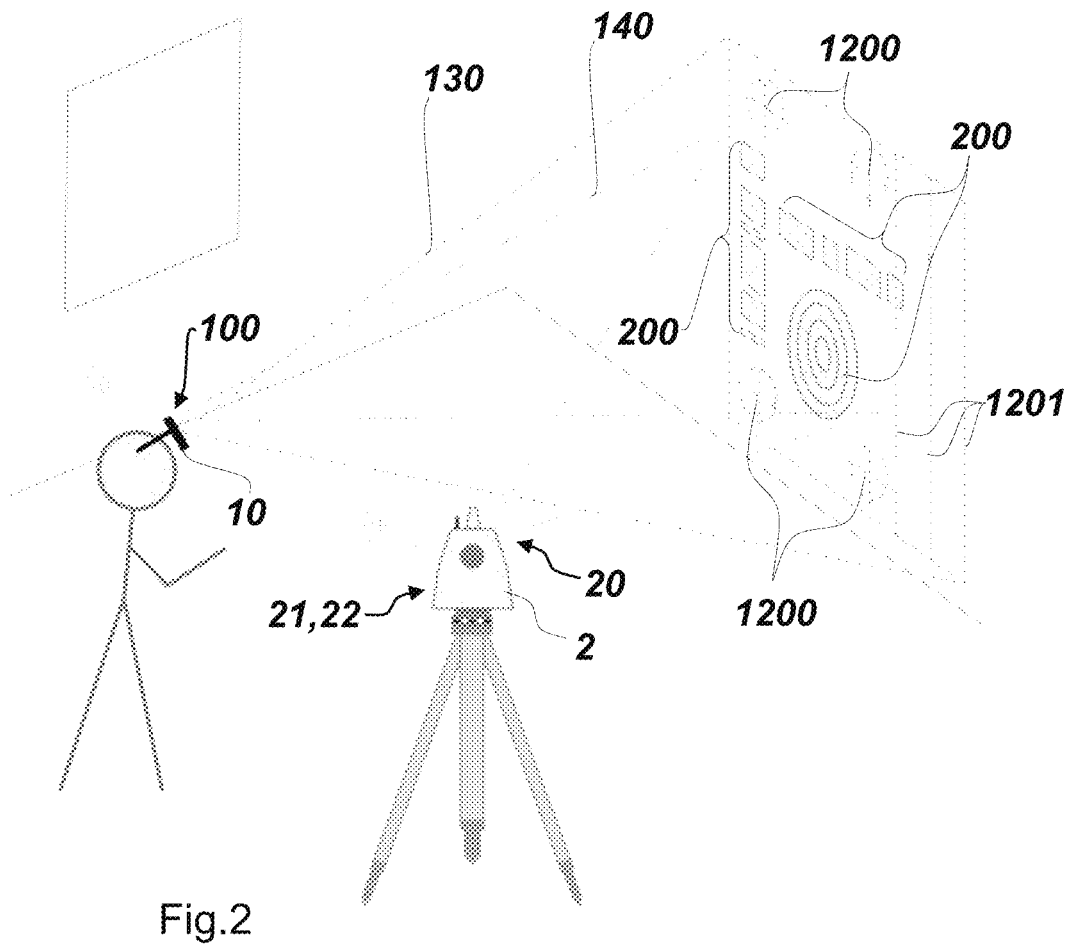
Fig.2

SURVEYING INSTRUMENT, AUGMENTED REALITY (AR)-SYSTEM AND METHOD FOR REFERENCING AN AR-DEVICE RELATIVE TO A REFERENCE SYSTEM

CROSS-REFERENCE TO RELATED APPLICATIONS

This application claims priority to European Patent Application No. 17193339 filed on Sep. 26, 2017. The foregoing patent application are incorporated herein by reference.

FIELD OF INVENTION

The present invention relates to a surveying instrument and an Augmented Reality (AR)-system. More particularly, the present invention relates to a surveying instrument and an Augmented Reality (AR)-system for use in at least one of metrology, geodesy, building construction, and civil engineering.

BACKGROUND

In the fields of metrology, geodesy, building construction, and civil engineering, important key factors are planning, progress observation, documentation, as well as the distribution of instructions and assistance. In many regards, those aspects are getting more and more complex and dynamic, in particular due to the many parties and data involved, fluctuating human and/or objective resources, increased complexity and amount of the interim or end results, tighter schedules, increased costs of human resources, etc. Work that was formerly planned and observed by one manager is nowadays too complex for a single person and splitting the jobs and assigning them to multiple people often fails due to a mismanagement of interfaces. Therefore, it has been tried to expand automation and computerisation in this technical field. In the art of building construction EP 2 629 210 is giving an example of a so called Building Information Modelling (BIM)-system.

Basis of such a construction site system usually is a three-dimensional model of the construction site which may be enriched with locally assigned information. Often this BIM-model is managed centrally on a server and retrievable through the network such that the retrieving devices always have access to the most updated version of the model. For example, a site manager may continuously implement any changes in the structure of the building or changes of plans.

As being common nowadays, construction sites are managed with help of computer based systems wherein data of various kinds are collected on servers and are shareable throughout a device network. In particular, said systems coordinate and spread supportive visualisations, work packages, checking instructions, and measuring instructions through the network to the workers and craftsmen who wirelessly receive the information from the server with their devices.

As a trending technology, Augmented Reality (AR) is an advanced way to provide such information to users, and thus, surveying systems are already popular auxiliaries in the mentioned technical fields for supporting users with referenced visualisations of AR-data, such as measurement data (e.g. point clouds), descriptive texts, descriptive numbers, instructions, check plans, surveying plans, two- or three-dimensional objects, navigational indications, navigational maps, images, and/or video clips.

In the mentioned arts, Augmented Reality (AR) systems are often utilised for supporting users on a site by referenced visualisations. Augmented Reality (AR)-systems comprising wearables such as AR-glasses or AR-helmets (in short: AR-devices) are getting increasingly available and performant. Such AR-systems usually comprise at least one marker which is precisely arranged in a pre-defined pose relative to a coordinate system, which the AR-device may reference itself to by means of the marker. Once locked in into the coordinate system, the AR-device is able to display virtual objects with a precise spatial link to the coordinate system, i.e. to the natural environment. The locked-in-status is for example maintained continuously by scanning the marker and analysing its appearance again and again.

In order to overlay the AR-data at the correct place within a display of an AR-device, such as within a head-mounted display (HMD) of an AR helmet or within a screen of a tablet computer, so that an observer (the user of the AR-device) perceives the AR-data as being spatially linked (referenced) to his environment, a pose of the AR-device relative to a reference system is detected permanently. These overlays augment the reality with artificial visualisations. Known referencing procedures are image based determinations of the pose of the AR-device relative to the reference system which itself has a known pose. For example, such pose detections can be achieved by computer vision, in particular image resection. Common means for referencing an AR-device relative to a reference system are markers, in particular QR-markers or characteristic physical features distinctive by according image features.

Known AR-devices rely on imaging sensors or inertial sensors for tracking their position within the scene. The level of accuracy with which an AR-object can be "locked" at a precise position in the real scene is limited, especially in dark environments or environments where only few features used as reference can be extracted from the video stream.

SUMMARY

The present invention therefore provides an improved AR-system and particularly aims at improving the positioning accuracy of displayed AR-data on the display of an AR-device. A further particular object of the invention is to provide more robust and more precise coincidence of the coordinate system of the AR-device with the coordinate system of a BIM-model.

The improvements for the user and for the usage of the AR-system according to the invention refer to at least one of: increased ergonomics, higher robustness in low-light and bright daylight situations, time savings, and higher precision.

The achievement of at least one of the mentioned improvements may be provided by the involvement of a surveying instrument which comprises a projector for the provision of infrared-ranged referencing markers. Such surveying instrument is commonly present in the working environments outlined above and has the capability of referencing its own inner coordinate system with regard to the environment (e.g. by matching a point cloud with a BIM-model, or by precisely surveying referencing points such as landmarks, special signs for referencing or retro-reflectors).

To survey a target point, or in particular a plurality of points, in a scene, numerous geodetic surveying instruments are well known from prior art. As standard spatial data, distance and direction, or solid angles, from a measuring apparatus to the target point to be surveyed, are recorded and, in particular, the absolute position of the measuring apparatus is acquired with the help of possibly existing reference points. Widely known examples of such geodetic surveying instruments are laser scanners, laser trackers, tachymeters or total stations, wherein the latter is also referred to as electronic tachymeters or computer tachymeters. A geodetic survey instrument of prior art is described, for example, in the publication document EP 1 686 350. Such apparatuses have electronic sensor angle and distance measurement functions, which allow the determination of direction and distance to a selected target point. The angle and distance quantities are in this case determined in the internal reference system of the apparatus and, for an absolute position determination, may also be correlated with an external reference system.

Modern surveying instruments have a computer comprising microprocessors for the digital post-processing and storage of acquired measurement data. The instruments are generally produced in a compact and integrated design, usually with coaxial distance and angle measurement elements as well as calculation, control and storage units integrated in the instruments.

Surveying instruments furthermore usually have a radio link interface (or based on other wireless technology such as WiFi or bluetooth) for setting up a wireless link to external peripheral components, for example to a data acquisition device which, in particular, may be formed as a hand-held data logger, remote control unit, array processor, notebook, AR-device (tablet PC, smart phone, glasses and/or helmet). These peripheral components may be capable to graphically display information related to the measurements.

In order to generate a point cloud, with a geodetic measuring device, such as a terrestrial laser scanner or a total station, an object, an inside scene, such as a room in a building, or an outside scene, such as a façade of a building, may be scanned. Such scenarios (settings) are commonly surveyed with 3D laser scanners with use of the time-of-flight (TOF) measuring method in order to sample a cloud of 3D points within a coordinate system. Additionally, a camera may be associated with a laser scanner and may be configured to capture images associated with the setting being scanned for providing an "instrument-centric" view. Furthermore, such instruments may also be equipped with a display showing this instrument-centric view.

AR-devices usually establish a referenced status relative to the environment by detecting and identifying set-up artificial targets such as QR-markers. Setting up the markers is a challenging and time consuming task, because it requires planning of the arrangement and installing of these targets in order to fulfil visibility constraints (at least three markers should be visible from each setup, or the marker should be large enough to extract its orientation from the image features). A second way for referencing an AR-device relative to its environment is an image-based scan of the structure of the environment and matching this structure with a known three-dimensional BIM-model. However, for this second method, a substantial and sufficiently structured overlap of the captured scene must be given at all times to provide a stable referencing. Especially in a near-field application, such as in drilling operations close to a wall, structure of the captured scene is often rare. The AR-device according to the invention overcomes these difficulties.

Generally, an AR-system according to the invention supports a user by providing visual information (AR-data), e.g. for identifying locations of drill holes, cutting paths, part placings, or for guiding through a work package with geo-referenced instructions (animated or static). The AR-device has at least one visual sensor configured for capturing Infrared (IR)-range images and at least one inertial sensor such as a gyroscope, an IMU, or an accelerometer for motion tracking. The inertial sensor is particularly used for calculating the position and orientation of the AR-device and therewith for a coarse positioning. The visual sensor may be a wide-angle camera, a stereo-camera or a depth camera.

A computer for processing the transformations and referencing the AR-data may be comprised by the AR-device which may comprise at least one of a processor, a graphic processing unit (GPU) and a holographic processing unit (HPU). The computer, however, may also be provided in a cloud, i.e. the AR-device is connected to the server in a network and receives the AR-data and/or positions where to display the AR-data.

The components of the AR-system, i.e. the AR-device and the surveying instrument each may comprise a data communication unit which allows them to mutually communicate and transfer data among each other. The communication unit may be based on a technology of at least one of Blootooth, radio link, and WiFi. In a particular embodiment of the invention, the shape of the projected reference is determined by a pseudo-random code, a QR code, an ArUco code, an Aztec code, and the like. The projector may be embodied as a laser pico-projector (monochromatic or multichromatic) with IR-range. In a particular embodiment of the invention, the projected reference marker is adaptive with respect to position, size, shape, and/or intensity.

Some embodiments herein relate to a surveying instrument, an AR-system and a method for referencing an Augmented Reality (AR)-device relative to a reference system.

The surveying instrument according to one embodiment of the invention, which in particular is a total station, a laser tracker, or a laser scanner, may be adapted for acquiring three-dimensional measuring points with respect to an inner coordinate system of the surveying instrument, and may have a measuring unit defining the inner coordinate system and comprising: a support mounted on a base and rotatable relative to the base about an azimuth axis, an emitting unit for providing a transmission beam, a receiving unit for detecting a reception beam, a directing unit mounted in the support, rotatable relative to the support about an elevation axis, and configured for directing the transmission beam from the emitting unit towards a scene, directing the reception beam from the scene to the beam receiving unit, a projector configured for projecting a light pattern onto a surface in the scene, wherein the pose, in particular and the dimensions, of the light pattern is definable relative to the inner coordinate system, and an instrument computer configured for controlling the measuring unit and the projector, referencing the inner coordinate system relative to a reference system based on measurement data obtained with the measuring unit, in particular wherein reference points are measured and/or the scene as a whole is measured and compared to a model of the scene, in particular wherein the instrument computer is configured for at least one of receiving, generating and storing the model of the scene and the pose of the model of the scene relative to the reference system, wherein the projector is configured for providing a referencing marker as the light pattern, wherein the referencing marker is designed to allow AR-devices to reference their pose relative to the reference system.

At least one of the projector and the instrument computer may be configured for adapting the pose, in particular and the dimensions, of the referencing marker based on AR-data, in particular based on the pose of said AR-data, wherein the instrument computer may be configured for at least one of receiving, generating and storing the AR-data, and the dimensions and the pose of the referencing marker relative to the reference system.

The surveying instrument may comprise an instrument communication unit configured for sending and receiving information, in particular for sending the AR-data and/or a model of the scene and/or referencing points in the scene, and wherein at least one of the projector and the instrument computer may be configured for adapting the pose, in particular and the dimensions, of the referencing marker based on information received by the instrument communication unit, in particular wherein the information comprise position information of the AR-device, in particular wherein the information comprise pose information of the AR-device.

At least one of the projector and the instrument computer may be configured for adapting the pose, in particular and the dimensions, of the referencing marker based on a distance to the projected referencing marker, in particular based on a current value of said distance, wherein the measuring unit is configured for obtaining the distance.

The projector may be configured for emitting the light of the referencing marker in a wavelength invisible to the human eye, in particular wherein the light of the referencing marker has a wavelength in the range of infrared or near-infrared light.

The AR-system according to some embodiments of the invention comprises a surveying instrument according to the description herein, and an AR-device, in particular AR-glasses or an AR helmet, having a sensor unit comprising a visual sensor, in particular a camera, in particular more than one camera, wherein the visual sensor is configured for capturing the scene, a display configured for providing a real view of the scene, and overlays onto the real view according to AR-data, wherein the AR-data have a defined pose relative to the reference system, a device computer configured for controlling the sensor unit, at least one of receiving, generating and storing the AR-data, and the dimensions and the pose of the referencing marker relative to the reference system, and determining a pose of the AR-device relative to the reference system based on the projected referencing marker captured by the visual sensor, generating the overlays based on the pose of the AR-device relative to the reference system.

The sensor unit may further comprise an inertial sensor, in particular a gyroscope, accelerometer, or an Inertial Measuring Unit (IMU), and the device computer may be configured for at least one of determining the pose of the AR-device relative to the reference system, and generating the overlays further based on the output of the inertial sensor.

The AR-device may comprise a device communication unit configured for sending and receiving information, in particular for receiving the AR-data, in particular for sending pose data (regarding the pose of the AR-device) to the surveying instrument.

The visual sensor may comprise an optical filter configured for allowing only or mostly light in a wavelength invisible to the human eye to pass, in particular wherein the filter upgrades a camera as the visual sensor.

The sensor unit may comprise an Infrared (IR)-camera or a Near Infrared (NIR)-camera.

The method according to some embodiments of the invention is adapted for referencing an Augmented Reality (AR)-device relative to a reference system, and comprises the steps: with a surveying instrument of an AR-system according to the description herein, projecting a referencing marker onto a surface in a scene, wherein the pose, in particular and the dimensions, of the referencing marker is defined relative to the reference system, with an AR-device of an AR-system according to the description herein, determining a pose of the AR-device relative to the reference system based on the projected referencing marker captured by the visual sensor, generating overlays based on the pose of the AR-device relative to the reference system, and providing the overlays onto a real view according to AR-data.

The method may further comprise: with the surveying instrument, referencing the inner coordinate system relative to a reference system based on measurement data obtained with the measuring unit.

The method may further comprise: with the surveying instrument, adapting the pose of the referencing marker based on at least one of the AR-data, information received by the instrument communication unit, a distance to the projected referencing marker, wherein the distance is obtained with the measuring unit.

The method may further comprise: with the surveying instrument and the AR-device each, at least one of receiving, generating and storing the AR-data, and the dimensions and the pose of the referencing marker relative to the reference system.

The method may further comprise: with the surveying instrument, emitting the light of the referencing marker in a wavelength invisible to the human eye, and with the AR-device, capturing the referencing marker in the wavelength invisible to the human eye.

BRIEF SUMMARY OF THE DRAWINGS

In the following, the invention will be described in detail by referring to exemplary embodiments that are accompanied by figures, in which:

FIGS. 1a and 1b: show exemplary Augmented Reality (AR)-devices of an AR-system according to the invention;

FIGS. 2-4: show exemplary use cases of the AR-system according to the invention, i.e. embodiments of the method according to the invention;

DETAILED DESCRIPTION

Figure 3:
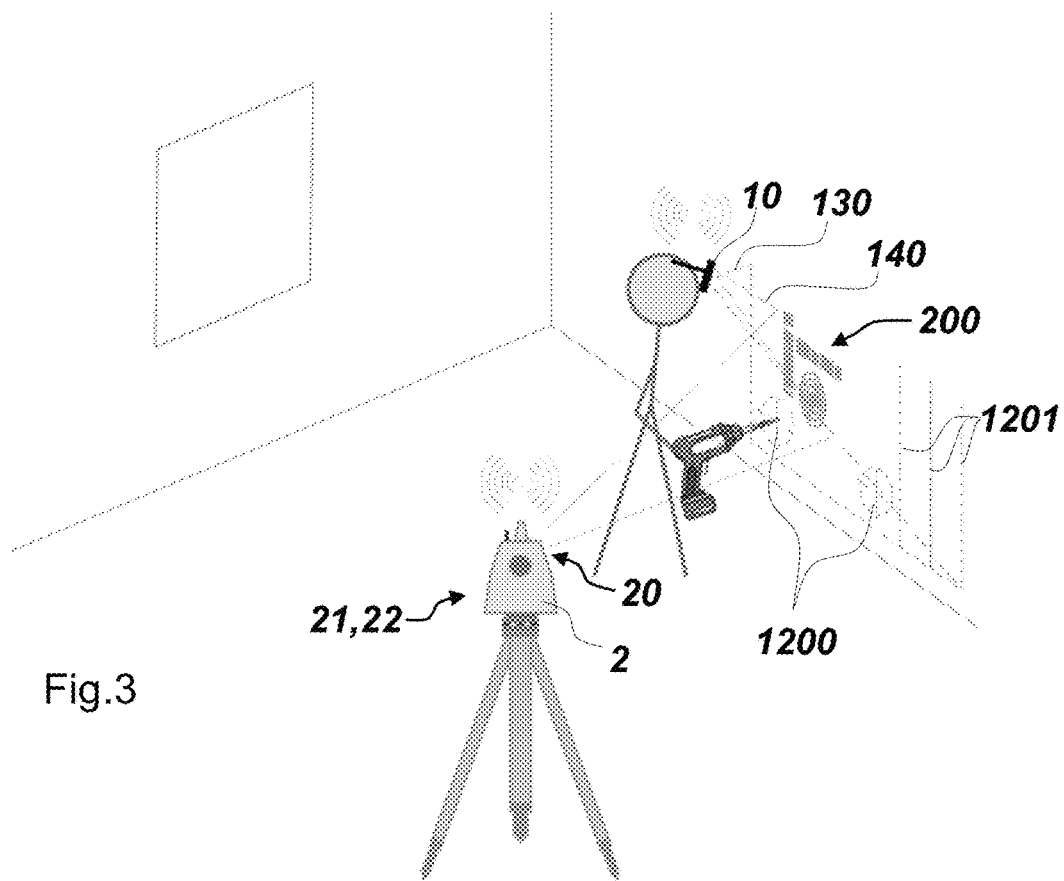

FIGS. 1a and 1b show two embodiments 10/11 of an Augmented Reality (AR)-device according to the invention, i.e. AR-glasses 10 and an AR-helmet 11. An AR-device according to the invention comprises a visual sensor 100/101 configured for capturing images in infrared and/or near-infrared range. The visual sensor 100/101 in particular comprises at least one of: an infrared camera, a near-infrared camera, a panoramic camera, a depth cameras). The AR-device further comprises a display 120/121 for displaying AR-data, and a computer 110/111 for controlling the visual sensor 100/101 and the display 120/121. The display shown in the two examples of FIGS. 1a and 1b may comprise a projector (not shown) for projecting the AR-data onto the display 120/121. Other embodiments of the AR-device according to the invention are handheld devices such as smart phones or tablet computers. Such handhelds usually also comprise a visual sensor (camera), a computer (processor) and a display (screen) and are configured to display referenced AR-data.

According to the invention, the computer is configured for receiving or storing AR-data and referencing markers which are assigned to a reference system. For the receiving functionality, the AR-device may comprise a wireless communication unit (using e.g. WiFi, Bluetooth, radio link, etc.) for at least one of: connecting to, communicating with, and transferring data from/to a server. Such server may for example be a controller held as equipment by the user or a cloud computer. For the storing functionality, the AR-device may comprise a data storage unit, such as a hard disk or a removable storage card.

The visual sensor is configured to visually capture the environment in the infrared range. When the visual sensor has captured a referencing marker, the computer is configured for identifying a corresponding reference system to which the captured referencing marker is assigned. The computer is further configured for determining a pose of the AR-device relative to the identified reference system, and thereby for establishing a referenced status. Determining the pose of the AR-device relative to the identified reference system is performed by methods known in the art, i.e. for example image resection wherein the known structure of the captured marker is analysed.

The AR-device may further comprise a position and orientation sensor (pose sensor) (not shown) configured to provide position and orientation data (pose data) for supporting the pose determination. Such a pose sensor may for example comprise at least one of: an Inertial Measuring Units (IMU), a gyroscope, a magnetometer, an accelerometer, a Global Navigation Satellite System (GNSS) sensor, and the like.

The displays 120 and 121 may be transparent and the AR-data are visualised by a projection onto the transparent display. The displays may, however also be embodied as a screen, such that the AR-system as described herein could be understood as Virtual Reality (VR)-system.

FIG. 2 shows an exemplary embodiment of the AR-system according to the invention. In the shown situation, a craftsman plans to drill holes and cut a channel into a wall inside a building. For this purpose, the AR-system is configured to provide supportive AR-data, i.e. position marks 1200, 1201, onto the AR-device 10 worn by the craftsman. The surveying instrument 2 comprises an infrared projector 20 for providing a referencing marker 200 which allows the AR-device 10 to reference itself (i.e. its pose) relative to a reference system. The surveying instrument 2 further comprises a computer 21 and a measuring unit 22. The projected referencing marker may as well have a wavelength in the ultraviolet range or in any other practical range, wherein the visual sensor is configured to detect radiation in the respective range.

For sensing the infrared or near-infrared referencing marker 200, the AR-device 10 has an infrared or near-infrared visual sensor 100 which has a field of view 140. By choosing the infrared or near-infrared range for projection and capture, the referencing marker is not visible for spectators or to the user of the AR-device. In this regard the surveying instrument 2 and the AR-device 10 cooperate imperceptible to the human eye.

Further, one advantage of operating in the infrared or near-infrared range is an improved detectability of the referencing marker 200 when the scene is exposed to strong daylight. In this case, a visual sensor of the AR-device that is embodied as a camera operating in a light range visible to the human eye would have difficulties to detect referencing markers which are provided by a projector operating in a light range visible to the human eye. The AR-system according to the invention works reliably and stably under daylight circumstances.

In order to project the referencing marker 200 at the correct location (i.e. the location within the building structure it is assigned to), the surveying instrument 2 is itself referenced with respect to the reference system. This means that the inner coordinate system of the surveying instrument is spatially correlated to the reference system. For example, if the surveying instrument is embodied as a laser scanner, a scan of the scene could be performed from an unspecified position of the laser scanner. By matching the scanned three-dimensional point cloud of the scene with a Building Information Modeling (BIM)-model of the building, the position and orientation of the laser scanner with respect to the reference system can be determined. If the surveying instrument is embodied as a total station or as a laser tracker, at least three landmarks may be measured (e.g. windows corner, room corner, set-up reference reflectors or other reference points) by a single-point measurement in order to determine the position and orientation of the total station with respect to the reference system. Optionally, the referencing of the surveying instrument relative to the scene may also be performed based on image data, in particular wherein the visual sensor of the surveying instrument is used, or in particular wherein the surveying instrument comprises a further visual sensor operating in the range of wavelength visible to the human eye. The BIM-model may be the reference system or may comprise the reference system or may be spatially linked to the reference system.

In particular the position and orientation of the referencing marker 200 is predetermined within the BIM-system. A designer/engineer of the BIM-system may place the reference markers at strategically useful locations, e.g. such that the visual sensor of an AR-device of a user always or most of the time captures the reference markers within its field of view, wherein Points of Interests (POI) may be considered, such as places where the user plans to perform some work (as shown in FIG. 2). Therefore, once detected and identified by the AR-device, the position and orientation of the referencing marker 200 is immediately known to the AR-device. The AR-device may have stored the appearance and the pose of the referencing marker 200 or be configured to match a captured referencing marker with a database of referencing markers stored on a server. The circular signalling symbols shown above the user and above the surveying instrument in FIG. 2 are demonstrating this optional interconnectedness and/or connectedness (in each case) with an external server. An "offline" embodiment of the AR-system is however also possible. As mentioned, for this purpose the AR-device 10 and the surveying instrument 2 would have means for storing the appearance of at least one referencing marker and its/their location within the reference system, and the surveying instrument 2 would additionally store the BIM-model in order to be capable of referencing itself with respect to the scene.

Accordingly, the AR-glasses may store, or receive the AR-data from a server, i.e. the augmented information displayed for assisting the user. These AR-data are spatially related to the reference system, in particular to the BIM-model. The BIM-model may optionally also be stored on the AR-device or retrieved from the server.

Alternatively, if the AR-device 10 and the surveying instrument 2 are embodied as "offline" devices, they may be synchronised with the above mentioned data by a third device (e.g. a controller, a smart phone or a tablet pc), which has access to up-to-date data (AR-data, BIM-model, referencing markers; all aforementioned relative to the reference system) stored on a server, or stored on the third device itself. For example, the AR-device 10 and the surveying instrument 2 may each comprise a Near Field Communication (NFC)-interface, wherein the third device with its own NFC-interface may only be held against the NFC-interface of the AR-device and the surveying instrument in order to synchronise the data.

Alternatively, the surveying instrument 2 may be the device which is up-to-date because it comprises a communication unit allowing for retrieving newest data from the server. In this case, the AR-device may be held with its NFC-interface against the NFC-interface of the surveying instrument to be updated. As is obvious to one in the art, these online-offline constellations may be varied arbitrarily.

Whatever data distribution option is chosen, once the AR-device 10 is provided with a selection of AR-data 1200, 1201 and with a selection of at least one referencing marker 200, the AR-data may be overlaid onto the real view of the scene which the user has when he is wearing the AR-device in case the referencing marker 200 is situated within the field of view of the visual sensor 100.

Alternatively to the act of referencing the AR-device relative to the reference system by means of the referencing marker, the process can also be understood in such a way that the AR-device does not really "lock" in into the reference system but merely determines a spatial relationship between the referencing marker and AR-data assigned to the referencing marker. This process may be based on image processing, in particular in combination with supportive data of a pose sensor.

Additionally to the AR-data 1200, 1201 which are shown as location indications for drilling holes and cutting a channel, further AR-data may overlaid onto the display of the AR-device such as textual instructions about which tool to use or how to use the tool. Also, the AR-data may comprise power lines or water pipes which are inside the wall and to be avoided when treating the wall with the tool.

Optionally, the AR-device 10 may be configured to perform a Video Simultaneous Localisation and Mapping (VSLAM)-process in order to capture a coarse representation (three-dimensional point cloud) of the scene. If access (stored on the computer of the AR-device, or retrievable by the computer of the AR-device from a server to which the AR-device is wirelessly connected) to the BIM-model is provided, a coarse pose determination can also take place on side of the AR-device. When matched with the BIM-model, the coarse position of the AR-data to be displayed is known and also the direction where to look with the AR-device in order to achieve a lock on the referencing marker light pattern.

In particular, the AR-device may comprise an inertial sensor, such as an IMU, accelerometer, gyroscope, and the like, for supporting this referencing purpose. Using said internal referencing process of the AR-device may have advantages in terms of vibrations correction and global responsiveness.

The AR-device may be configured to, once the referencing marker 200 is detected and identified by the AR-device 10, request input by the user e.g. on what AR-data to show, should there be a plurality as in the shown example of FIG. 2 (drill holes/channel). A user input could be realised with voice control, gesture control, or by input with a third device such as a controller. Generally, the AR-device may request a confirmation of the user whether the AR-data should be shown at all.

In particular, the surveying instrument 2 disposes of the position of the AR-data (where the AR-data are linked to within the reference system or the BIM-model), and causes the projector 20 to project the marker accordingly on a surface adjacent to where the AR-data are linked, in particular wherein the AR-data and the projection of the referencing marker have the same position within the reference system or BIM-model.

FIG. 3 shows another embodiment of the invention. The user approaches the wall wearing his AR-device 10 because he is about to drill the holes which are marked on the display of the AR-device 10 by the AR-data 1200. As seen in FIG. 3, the referencing marker 200 shrank to a smaller size compared to the situation in FIG. 2. An adaptation has taken place because the field of view of the visual sensor 140 of the AR-device 10 now captures a smaller part of the wall. Would the referencing marker 200 still be as large as shown in FIG. 2, then the AR-device 10 could not be able to catch the marker as a whole. Therefore, the surveying instrument 2 may be configured in such a way that the projector 20 adapts the size of the referencing marker 200.

Similarly, the surveying instrument 2 may cause the projector 20 to project the referencing marker 200 at a different position in case the user changes his viewing direction such that the field of view of the visual sensor 100 might not catch the marker anymore.

Similarly, the surveying instrument 2 may cause the projector 20 to project the referencing marker 200 in a certain distortion in case the user's view of the marker has an angle too acute with the wall the marker is projected onto. In particular, the projector 20 may be configured to adapt the shape of the referencing marker 200 such that the visual sensor 100 of the AR-device 10 "perceives" the marker without distortion.

These adaptations may be achieved in many different ways. For example, the AR-device 10 and the surveying instrument 2 may comprise a data communication unit, and these communication units are used to send information from the AR-device to the surveying instrument.

Such information may be size (pixel-wise) of the referencing marker as captured by the visual sensor 100. In this case, the projection may for example be regulated such that the mentioned size remains the same or essentially the same, no matter what distance between the user and the projection plane (wall).

Such information may however also be the current pose of the AR-device relative to the reference system, or respectively: relative to the surveying instrument. With this information it may be determined which surface is momentarily captured by the field of view of the visual sensor 100. In this case, the projection may for example be regulated such that the referencing marker 200 remains always inside the mentioned surface. With the current pose of the AR-device it may also be determined under which angle the surface is momentarily captured. In this case, the projection may for example be regulated such that the referencing marker 200 remains always undistorted from the perspective of the visual sensor 100.

In case the size, shape, orientation etc. of the referencing marker 200 is varied, this variation may be communicated from the surveying instrument 2 to the AR-device, since the AR-device may use the appearance of the marker to reference itself with respect to the scene (reference system or BIM-model).

Figure 4:
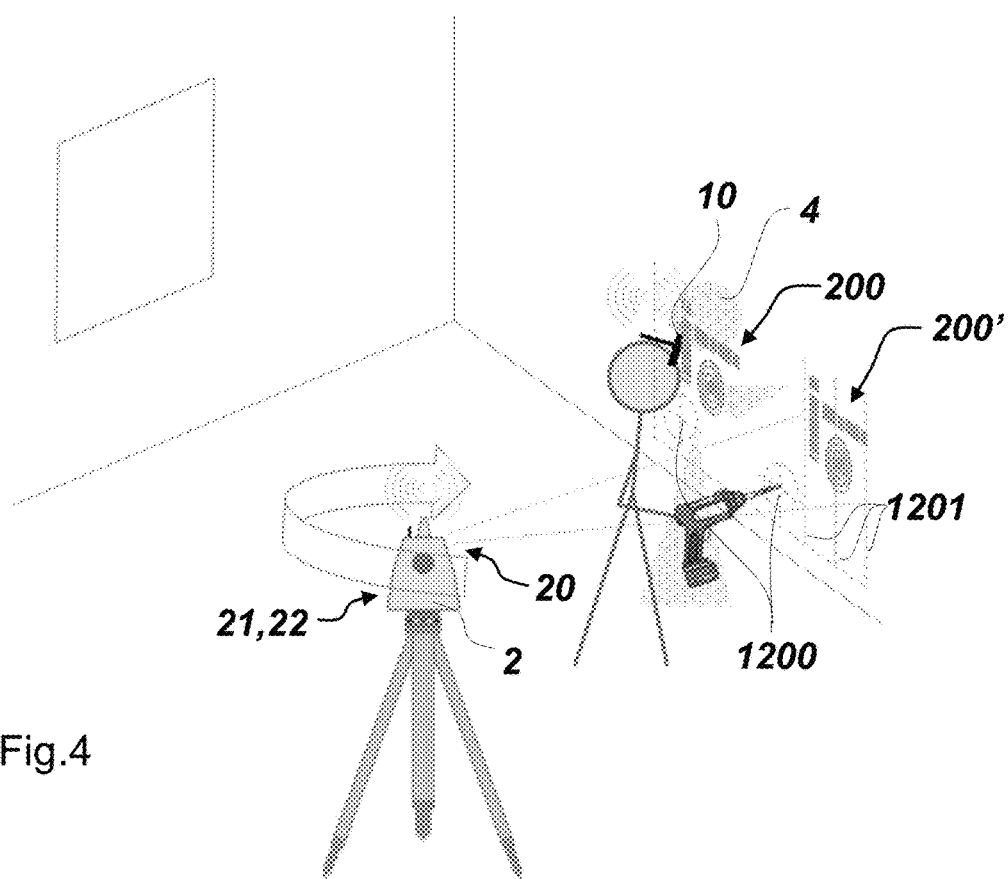

FIG. 4 shows a further embodiment of the invention. One problem emerging from the shown situation is that the referencing marker 200 is not fully projected on the surface of the wall where it is supposed to be projected. After the user finished drilling the left of the two holes in the wall indicated with AR-data 1200, he proceeds to the right hole and thereby crossing the line of projection of the referencing marker 200. Thus, alternatively to the regulation of the projection position based on the viewing angle of the user as mentioned above, the projection position may be regulated more simply based on a shadowing detection. For example, the measuring unit 22 of the surveying instrument 2, which works on a Time of Flight (TOF)-principle, may continuously monitor a distance value to the projection plane. In case of a disturbance such as a distance value reduction, the projection direction may dodge to the position indicated with 200'. Alternatively, the AR-device is configured to generate adjust commands for the projector to adjust the alignment of the referencing marker to a surface currently visible to the camera 100.

In case the visual sensor 100 does not capture the referencing marker, the AR-system may be configured to guide the user to a viewing angle where the marker is viewable again, e.g. by an arrow pointing towards the marker displayed on the AR-device.

Similarly, if the AR-device 10 is referenced because the reference marker 200 (or 200') is well visible to the visual sensor 100 (inside the field of view 140), indicating arrows may be displayed onto the display 120 of the AR-device 10 pointing in the direction of AR-data which are momentarily outside the user's field of view 130.

Figure 5A:
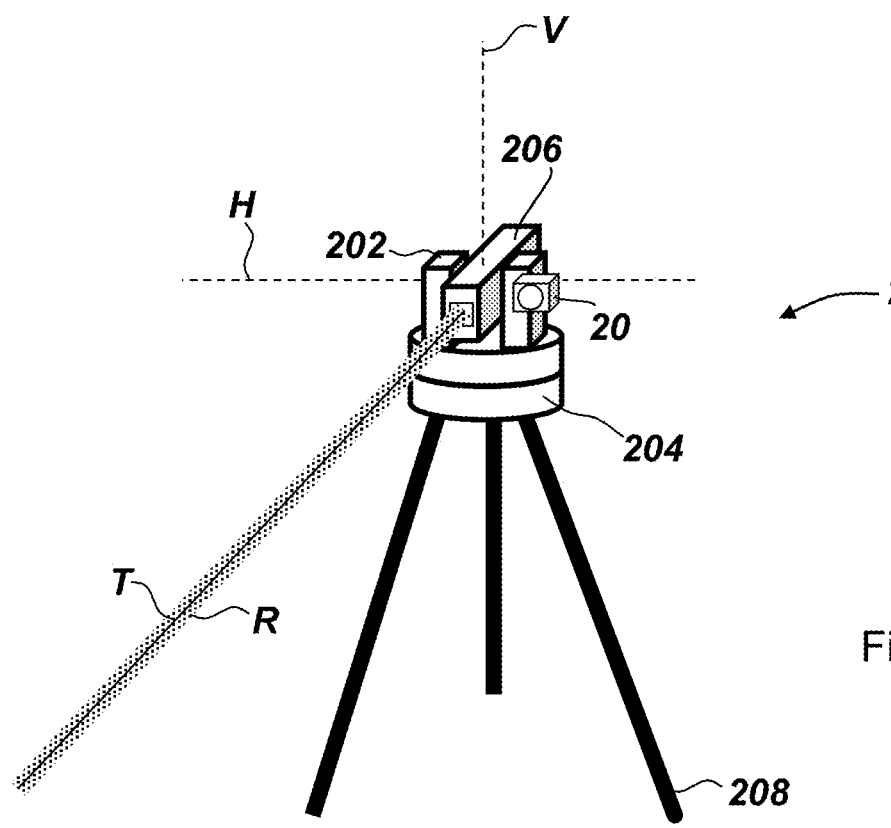
FIGS. 5a and 5b: show exemplary surveying instruments of an AR-system according to the invention.
Figure 5B:
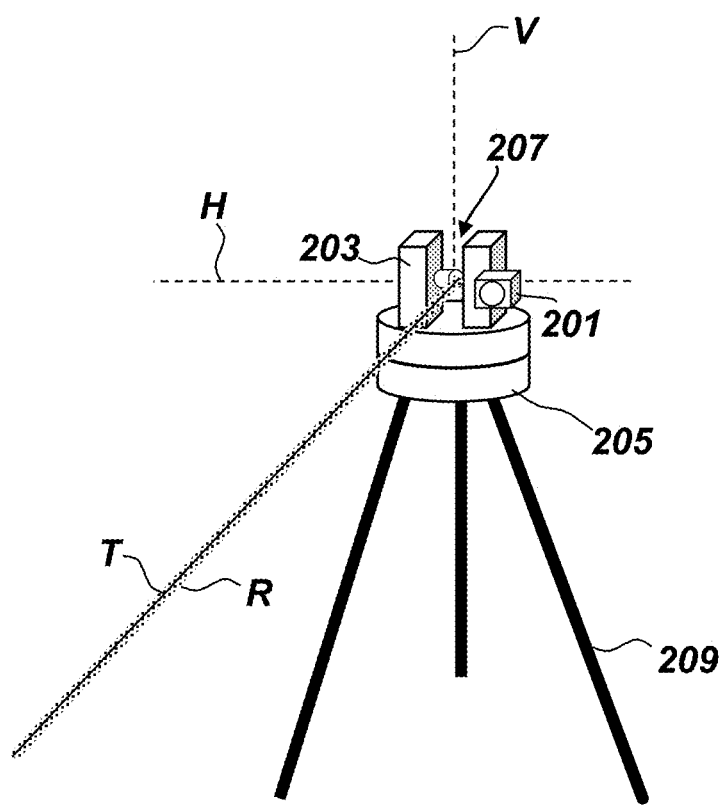

FIGS. 5a and 5b each show an exemplary surveying instrument according to the invention. FIG. 5a abstractly shows a total station, tachymeter, or theodolite, which all have a similar structure as shown. FIG. 5b shows a laser scanner which has a fast rotating mirror.

All surveying instruments have in common that they comprise a support 202/203 configure to rotate about a vertical axis V relative to a base 204/205, a beam directing unit 206/207 configured to rotate about a horizontal axis H relative to the support 202/203, an emitting unit and receiving unit which are arranged in the directing unit 206 or in the support 203. The emitting unit is configured to emit a transmission beam T and the receiving unit is configured to receive a reception beam R (which is the reflected transmission beam). The surveying instrument comprises a computer (not shown) which is configured to perform Time of Flight (TOF)-measurements based on the beams T an R. The surveying instrument further comprises motors and angle encoders for the rotation axes V and H, such that the TOF-measured distances can be assigned to solid angles (i.e. an elevation angle and an azimuth angle within an instrument-centric, inner coordinate system). The surveying instrument may stand on a tripod 208/209.

According to the invention, the surveying instrument comprises a projector 20/201 which is configured to project, in a defined alignment, IR- or NIR-projections as described herein. For this, the projector has a spatially known position and orientation relative to the inner coordinate system of the surveying instrument. The projector 20/201 may be attached to the surveying instrument as shown in the FIGS. 5a and 5b. The projector may however as well be integrated into the instrument housing (e.g. the support) or may be attached to a different component of the surveying instrument than is shown.

The emitter of the measuring unit may also function as a projector for projecting referencing marker as the light pattern. In this example, a projector as additional unit is obsolete. The directing unit can rotate around the horizontal axis and around the vertical axis in order to display the referencing marker at a defined position in the environment. The laser of the emitter can for example emit a multi-beam pattern with a still standing directing unit. Particularly when the surveying instrument is a laser scanner which has a high-speed rotating directing unit (mirror), the laser may emit single beams at defined rotatory positions of the directing unit, therewith providing a defined pattern on the wall with a display refresh rate according to the rotatory speed of the mirror. In particular, four points projected by the electronic distance measuring (EDM) unit can be used as base points for the AR-device. The surveying instrument may also be a theodolite/a total station, wherein the internal scanning unit (e.g. MEMS) or the EDM is utilised for the projection.

However the surveying instrument may be equipped—with or without projector as separate unit—in case the surveying instrument has a position from which a desired projection is not possible (e.g. around the corner), or the distance to the projection plane is merely too far, or the projection light would reach the projection plane in an angle too oblique, a "forwarding" rover may be utilised for the projection.

Figure 6:
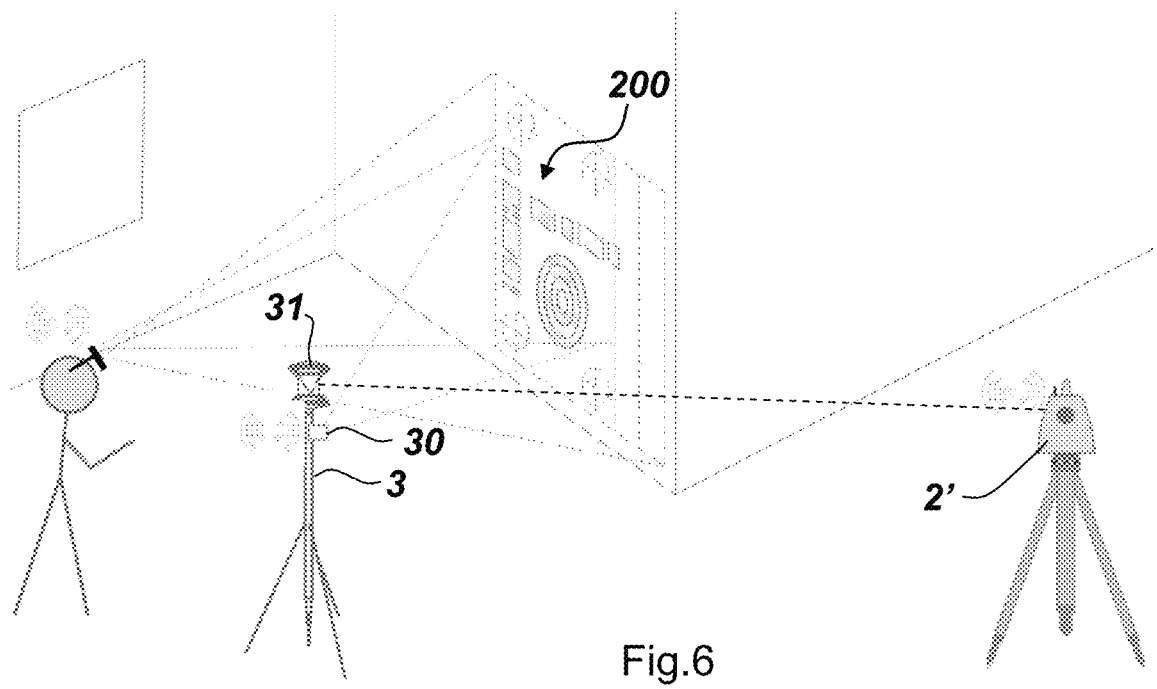
FIG. 6: shows an exemplary rover using the AR-system according to an embodiment of the invention.

Such rover may be embodied as a holder, a stand, or a carrier. For example, the rover may comprise a pole and a tripod as is shown in FIG. 6. The surveying instrument 2' is tracking the rover 3 by a reflector 31 comprised by the rover. The rover 3 also comprises a projector 30 which is motorised for rotations in two perpendicular axes. Just as in FIG. 2, the reference marker 200 is projected onto the wall. Since surveying instrument 2' is not able to reach the projection surface of the wall, it is keeping track of the rover by measuring its position in the room. The surveying instrument 2' has means for sending to the rover data on how the projector 30 needs to be aligned to achieve the desired projection of the referencing marker. Because the rover has a closer distance and more suitable alignment towards the wall, its projector 30 may be configured with a lower precision and/or light intensity compared to a projector that needs to master a projection from a farther distance.

Although the invention is illustrated above, partly with reference to some preferred embodiments, it must be understood that numerous modifications and combinations of different features of the embodiments can be made. All of these modifications lie within the scope of the appended claims.

The invention claimed is:

1. A surveying instrument, for acquiring three-dimensional measuring points with respect to an inner coordinate system of the surveying instrument, the surveying instrument comprising:
    a measuring unit defining the inner coordinate system and comprising:
        a support mounted on a base and rotatable relative to the base about an azimuth axis,
        an emitting unit for providing a transmission beam,
        a receiving unit for detecting a reception beam,
        a directing unit mounted in the support, rotatable relative to the support about an elevation axis, and configured for:
            directing the transmission beam from the emitting unit towards a scene, and
            directing the reception beam from the scene to the beam receiving unit,
    a projector configured for projecting a light pattern onto a surface in the scene,
    wherein the pose of the light pattern is definable relative to the inner coordinate system, and an instrument computer configured for:
controlling the measuring unit and the projector,
referencing the inner coordinate system relative to a reference system based on measurement data obtained with the measuring unit,
wherein the projector is configured for providing a referencing marker as the light pattern having a pose and dimensions relative to the reference system, wherein the pose and dimensions of the referencing marker are configured to be captured by a visual sensor of an AR-device to determine a pose of the AR-device relative to the reference system.

2. The surveying instrument according to claim 1, wherein the projector is configured for adapting the pose of the referencing marker based on AR-data, wherein the instrument computer is configured for at least one of receiving, generating and storing the AR-data, and the dimensions and the pose of the referencing marker relative to the reference system.

3. The surveying instrument according to claim 1,
wherein the surveying instrument comprises an instrument communication unit configured for sending and receiving information, and
wherein the projector is configured for adapting the pose of the referencing marker based on information received by the instrument communication unit.

4. The surveying instrument according to claim 1,
wherein the projector is configured for adapting the pose of the referencing marker based on a distance to the projected referencing marker, wherein the measuring unit is configured for obtaining the distance.

5. The surveying instrument according to claim 1,
wherein the projector is configured for emitting the light of the referencing marker in a wavelength invisible to the human eye.

6. An Augmented Reality (AR)-system, comprising:
a surveying instrument according to claim 1, and
an AR-device having:
a sensor unit comprising a visual sensor, wherein the visual sensor is configured for capturing the scene,
a display configured for providing
a real view of the scene, and
overlays onto the real view according to AR-data, wherein the AR-data have defined dimensions and a defined pose relative to the reference system,
a device computer configured for:
controlling the sensor unit,
at least one of receiving, generating and storing the AR-data, and the dimensions and the pose of the referencing marker relative to the reference system,
determining a pose of the AR-device relative to the reference system based on the projected referencing marker captured by the visual sensor, and
generating the overlays based on the pose of the AR-device relative to the reference system.

7. The AR-system according to claim 6, wherein the sensor unit further comprises an inertial sensor, and wherein the device computer is configured for at least one of:
determining the pose of the AR-device relative to the reference system based on the output of the inertial sensor, and
generating the overlays.

8. The AR-system according to claim 6, wherein the AR-device comprises a device communication unit configured for sending and receiving information.

9. The AR-system according to claim 6, wherein the visual sensor comprises an optical filter configured for only allowing light in a wavelength invisible to the human eye to pass.

10. The AR-system according to any of claim 6, wherein the sensor unit comprises an Infrared (IR)-camera or a Near Infrared (NIR)-camera.

* * * * *